(12) United States Patent
Braun et al.

(10) Patent No.: US 11,500,006 B2
(45) Date of Patent: Nov. 15, 2022

(54) METHOD AND DEVICE FOR LOCATING FAULTS ALONG AN ENERGY SUPPLY CHAIN FOR DC CURRENT SYSTEMS

(71) Applicant: SIEMENS MOBILITY GMBH, Munich (DE)

(72) Inventors: Wolfgang Braun, Viereth-Trunstadt (DE); Stephan Noelkensmeier, Erlangen (DE); Martin Schmidt, Erlangen (DE)

(73) Assignee: Siemens Mobility GmbH, Munich (DE)

( * ) Notice: Subject to any disclaimer, the term of this patent is extended or adjusted under 35 U.S.C. 154(b) by 481 days.

(21) Appl. No.: 16/628,046

(22) PCT Filed: Jun. 25, 2018

(86) PCT No.: PCT/EP2018/066851
§ 371 (c)(1),
(2) Date: Jan. 2, 2020

(87) PCT Pub. No.: WO2019/020296
PCT Pub. Date: Jan. 31, 2019

(65) Prior Publication Data
US 2021/0141010 A1 May 13, 2021

(30) Foreign Application Priority Data
Jul. 25, 2017 (DE) .................. 10 2017 212 730.9

(51) Int. Cl.
*G01R 31/08* (2020.01)
*G05B 23/02* (2006.01)
(Continued)

(52) U.S. Cl.
CPC ......... *G01R 31/085* (2013.01); *G05B 23/024* (2013.01); *H02H 3/006* (2013.01); *H02H 3/087* (2013.01); *H02H 7/268* (2013.01)

(58) Field of Classification Search
CPC .... G01R 31/08; G01R 31/085; G01R 31/086; H02H 3/006; H02H 3/087; H02H 7/268; G05B 23/024
See application file for complete search history.

(56) References Cited

U.S. PATENT DOCUMENTS 3,978,374 A 8/1976 Rohr
4,890,183 A 12/1989 Champiau
(Continued)

FOREIGN PATENT DOCUMENTS

CN 101738569 A 6/2010
CN 101871990 A 10/2010
(Continued)

OTHER PUBLICATIONS

Translation of EP 2998750 B1. Nov. 13, 2019. (Year: 2019).*
(Continued)

*Primary Examiner* — Jared Fureman
*Assistant Examiner* — Christopher J Clark
(74) *Attorney, Agent, or Firm* — Laurence A. Greenberg; Werner H. Stemer; Ralph E. Locher

(57) ABSTRACT

A method and a device for locating faults along an energy supply chain for DC current systems. To provide a reliable fault location for DC current systems, at least one reference short circuit is generated at a known reference fault location of the energy supply chain and at least one physical property of the energy supply chain is determined during the reference short circuit. At least one physical property of the energy supply chain during the operational short circuit is determined, and a fault location of the operational short
(Continued)

circuit is determined, taking into account at least the determined physical properties during the reference short circuit and the operational short circuit and the reference fault location.

16 Claims, 2 Drawing Sheets

(51) Int. Cl.
*H02H 3/00* (2006.01)
*H02H 3/087* (2006.01)
*H02H 7/26* (2006.01)

(56) References Cited

U.S. PATENT DOCUMENTS

| | | | |
|---|---|---|---|
| 5,420,511 A | 5/1995 | Allin et al. | |
| 9,274,161 B1 | 3/2016 | Tatcho et al. | |
| 9,910,080 B2 | 3/2018 | Kampfer | |
| 2016/0266192 A1* | 9/2016 | Burek | G01R 31/088 |
| 2017/0199237 A1 | 7/2017 | Dzienis et al. | |
| 2018/0284180 A1 | 10/2018 | Ha et al. | |

FOREIGN PATENT DOCUMENTS

| | | | |
|---|---|---|---|
| CN | 103532091 A | 1/2014 | |
| CN | 203561724 A | 4/2014 | |
| CN | 103983892 A | 8/2014 | |
| CN | 104820159 A | 8/2015 | |
| CN | 105301447 A | 2/2016 | |
| CN | 105705956 A | 6/2016 | |
| CN | 106062575 A | 10/2016 | |
| CN | 106199328 A | 12/2016 | |
| CN | 106468752 A | 3/2017 | |
| DE | 4125446 A1 * | 2/1993 | G01R 31/08 |
| DE | 102014217972 A1 | 3/2016 | |
| EP | 0341117 A1 | 11/1989 | |
| EP | 2998750 A1 | 3/2016 | |
| EP | 3193420 A1 | 7/2017 | |
| EP | 2998750 B1 * | 11/2019 | G01R 31/08 |
| JP | 2003302440 A | 10/2003 | |
| RU | 2237905 C2 | 10/2004 | |
| UA | 49785 C2 | 10/2002 | |
| WO | 2014067831 A1 | 5/2014 | |

OTHER PUBLICATIONS

Translation of DE 4125446 A1. Feb. 4, 1993. (Year: 1993).*
Zhengjun Tong et al: "A Fault Location Method in Shipboard DC Zonal Electrical Distribution Systems" Marine Electric & Electronic Engineering; vol. 34, No. 8; Aug. 2014.
Bornard P et al: "A Prototype of Multiprocessor Based Distance Relay", IEEE Transactions on Power Apparatus and Systems, 81 SM 384-7, vol. PAS-101, No. 2, Feb. 1982.
He, Jinghan et al.: "A Fault Location Method for Flexible DC Distribution Network Based on Fault Transient Process", Power System Technology, vol. 41, No. 3, Mar. 2017—English abstract.
Yang, Jin et al.: "Short-Circuit and Ground Fault Analyses and Location in VSC-Based DC Network Cables", IEEE Transactions on Industrial Electronics, vol. 59, No. 10, Oct. 2012.

* cited by examiner

METHOD AND DEVICE FOR LOCATING FAULTS ALONG AN ENERGY SUPPLY CHAIN FOR DC CURRENT SYSTEMS

BACKGROUND OF THE INVENTION

Field of the Invention

In railway power supply systems, short circuits can occur along the energy supply chain during operation. It is irrelevant whether a catenary system, a third-rail system or another system is used. These operational short circuits may be caused, for example, by faulty vehicles or trains, faulty catenary parts, accidents involving road vehicles, cranes or as a result of fallen trees. Supply sections of the energy supply chain in which the short circuits occur are usually up to 2 km long in urban transport and up to 20 km long in long-distance transport. If an operational short circuit occurs, the rail operator knows in which supply section of the energy supply chain the short circuit is located. But there is no information about the precise fault location of the operational short circuit. Hereinafter, an operational short circuit is a short circuit occurring during operation.

In DC rail systems, the operator of the energy supply chain is usually unable to detect the fault location of an operational short circuit. He is dependent on information from third parties regarding the fault location. In the case of a faulty train or an accident, these can be reported by the vehicle driver, for example. However, for example in the event of a fault resulting from damaged catenary components or insulation faults, the entire supply section must be shut down to find the fault location.

In alternating current systems, methods are known which are used to automatically determine the fault location.

In DC rail systems such methods have not been used thus far.

In RU 22 37 905 C2 a method for locating faults is described which is also applicable to direct current. However, this method has not been used so far.

Operating short circuits can also occur in other DC current systems such as, for example, HVDC (high-voltage direct current) or a power supply for data centers, the rapid location of which is advantageous. The invention can therefore be used for different types of DC current systems.

SUMMARY OF THE INVENTION

The task of the invention is therefore to provide a method and a device for locating faults along an energy supply chain in DC current systems, by means of which the fault location can be determined reliably and simply.

According to the invention, the object is achieved by a method for locating faults along an energy supply chain in DC current systems in which at least one reference short circuit is generated at a known reference fault location of the energy supply chain and at least one physical property of the energy supply chain is determined during the reference short circuit, in which at least one physical property of the energy supply chain is determined during the operational short circuit and in which a fault location of the operational short circuit is determined, taking into account at least the determined physical properties during the reference short circuit and the operational short circuit and the reference fault location.

The invention further relates to a device for locating faults along an energy supply chain for DC current systems, comprising a measuring device which is designed to determine at least one physical property of the energy supply chain during a reference short circuit and an operational short circuit, and comprising a computing device which is designed to determine a fault location of the operational short circuit, taking into account at least the determined physical properties during the reference short circuit and the operational short circuit and a reference fault location.

By means of the solution according to the invention, the fault location of the operational short circuit can be reliably determined in a simple manner. For this purpose, a reference measurement is first performed in which the reference short circuit is generated at a known reference fault location. The reference short circuit differs from the operational short circuit in that it is intentionally generated during the reference measurement. During the reference short circuit, the measuring device determines at least one physical property of the energy supply chain, for example a temporal progression of the current and/or the voltage—that is to say, the leakage current and/or the error voltage—is determined. This at least one physical property and position of the known reference fault location are stored. If an operational short circuit now occurs during operation of the DC current system, according to the invention at least one physical property of the energy supply chain is determined during this operational short circuit, for example the leakage current and/or the error voltage. The fault location of the operational short circuit can then be determined by the computing device, at least taking into account the at least one determined physical property during the reference short circuit and the at least one determined physical property during the operational short circuit and the reference fault location.

According to the invention, only this reference measurement must therefore be performed with the reference short circuit to then be able to determine a fault location of an operational short circuit occurring during operation of the DC current system.

By means of the automatically determined fault location, specific measures can be initiated very quickly in order to rapidly resume operation of the DC current system. Such a measure can be, for example, the targeted use of a maintenance team at the fault location of the operational short circuit. Alternatively, for example, a drone with a camera system could also be sent to the fault location initially to provide an initial image of the fault location. As a result, for example, a tree which has fallen onto the catenary can be detected immediately and countermeasures can be initiated.

The invention is frequently described hereinafter with reference to a DC rail system. This is only to be understood as an example, however. Application in other DC current systems is also advantageous and possible.

The solution according to the invention can be further developed by advantageous embodiments which are described hereinafter.

In this way, at least one calculation value that is dependent on the length of the energy supply chain can be determined at least by means of the determined physical property during the reference short circuit and by means of the reference fault location and the fault location of the operational short circuit, taking into account this calculation value and the determined physical properties during the operational short circuit. This has the advantage of simplifying the calculation of the fault location. In a particularly advantageous embodiment, for example, an inductance per length of the energy supply chain can be determined as a calculation value. The inductance is particularly suitable as a calculation value here because it relates the rate of change of the current to the voltage. As, for example, the rate of change of the leakage current can easily be determined, the invention can be used in a simple manner.

In order to further increase accuracy in determining fault locations, a resistance per length of the energy supply chain can be determined and taken into account in the determination of the fault location. The resistance, for example a cable resistance, of the energy supply chain can have a negative influence on accuracy in calculating the fault location and is therefore to be removed preferably.

In order to simplify the necessary measurements, the same physical property of the energy supply chain can be determined during the reference short circuit and during the operational short circuit. Furthermore, the temporal progression of the leakage current and/or the error voltage can be determined as the physical property of the energy supply chain during the reference short circuit and during the operational short circuit respectively. The determination of the leakage current and the error voltage can be performed in a simple manner and can therefore be used without great effort. In addition, further physical properties can be determined during the reference short circuit and during the operational short circuit.

In order to avoid possible damage to the DC current system, the operational short circuit can be detected and then the energy supply of the energy supply chain can be switched off and the at least one physical property of the energy supply chain can be determined during the operational short circuit until disconnection. By means of the solution according to the invention, the fault location can be determined even if, during the operational short circuit, the energy supply chain is only briefly supplied with energy as a result of disconnection. In particular, the further prospective course of the at least one physical property can be extrapolated. The prospective course is to be understood here as the course which would occur without the disconnection. This has the advantage that, as a result of the extrapolation, a longer course of the property is available, which considerably increases the accuracy of fault location. Extrapolation can take place, for example, by means of smoothing and/or linear regression using the least squares method. Extrapolation can also be used in the reference short circuit in order to obtain a longer course of the at least one physical property during the reference short circuit.

The power supply can be switched off in the event of a detected operational short circuit within less than 500 ms, in particular less than 200 ms.

In order to further increase accuracy in determining the fault location, in comparison to the operational short circuit, the energy supply cannot be switched off or switched off later in the reference short circuit. Thus, for example, the leakage current reaches a maximum, whereby the reference measurement is more informative.

In an advantageous embodiment of the device for locating faults according to the invention, the device can have at least one communication device which is designed to transmit the fault location of the operational short circuit, in particular to a control center of the DC current system. This has the advantage that the determined fault location can be forwarded quickly to the location requiring this information. In the case of a railway system, this may be, for example, the control center or a control station. In this case, the fault location can be transmitted in a cabled manner, for example where there is a network such as Ethernet, or wirelessly, for example via WLAN or GSM-R.

Furthermore, the device for locating faults for performing the method according to the invention can be designed according to one of the aforementioned embodiments.

Finally, the invention also relates to a protection and control device for DC rail systems, having a detection device which is designed to detect an operational short circuit on an energy supply chain of the DC current system. In order to reliably detect the fault location of an operational short circuit, it is provided according to the invention that the protection and control device has at least one device for locating faults according to one of the aforementioned embodiments.

The invention is described in more detail hereinafter with reference to the attached diagrams and the exemplary embodiments of the invention illustrated therein.

BRIEF DESCRIPTION OF THE SEVERAL VIEWS OF THE DRAWING

The diagrams show.

DESCRIPTION OF THE INVENTION

The invention is described hereinafter with reference to the exemplary embodiment of a protection and control device according to the invention illustrated in FIG. 1 and the diagrams in FIGS. 2 and 3.

Figure 1:
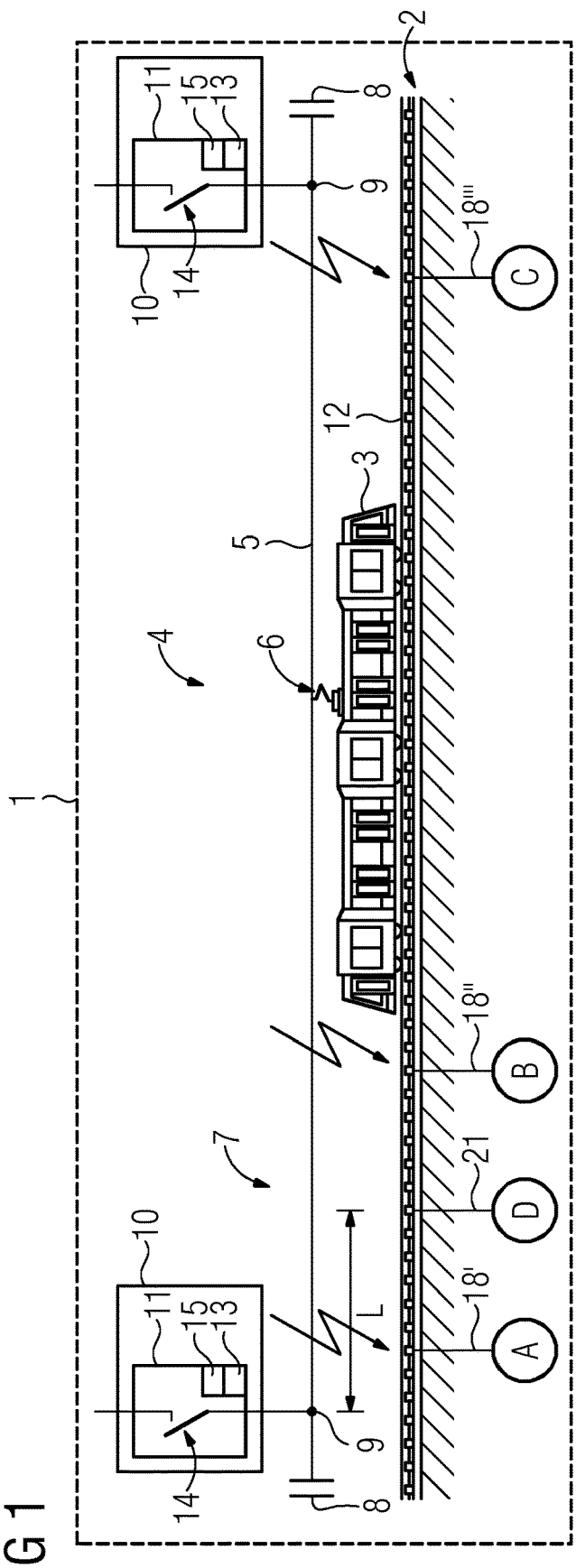
FIG. 1 A diagrammatic view of a DC rail system with protection and control devices according to the invention.
Figure 2:
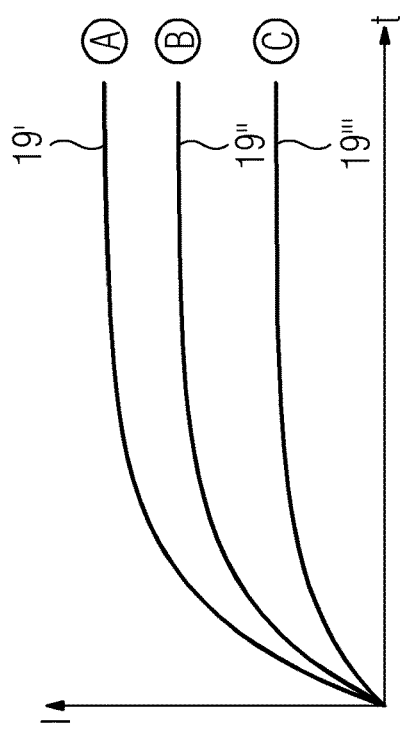
FIG. 2 A diagrammatic view of a prospective current course for short circuits at different fault locations in the railway system according to FIG. 1.

FIG. 1 shows a DC rail system 1 which is shown as a tram system by way of example. The DC rail system 1 has a track section 2 on which vehicles 3 move. The only vehicle 3 shown in FIG. 1 is designed as a tram by way of example. Furthermore, the DC rail system 1 comprises an energy supply chain 4 which supplies the vehicle 3 with electrical power. In the embodiment in FIG. 1, the energy supply chain 4 has a catenary 5 which is contacted by the vehicle by means of pantograph 6. The energy supply chain 4 usually comprises a plurality of supply sections 7, of which only one is shown in FIG. 1.

The supply sections 7 are arranged one behind the other along the track section 2 and separated from one another by separating points 8. Each supply section 7 is supplied with electrical power at at least one connection point 9 by an energy supply 10, for example a substation. In the embodiment in FIG. 1, the single supply section 7 shown is supplied with energy from two sides at two connection points 9. The energy supply 10 comprises at least one control panel 11, which supplies power to the connection point 9. A protection and control device according to the invention, which will be described in more detail hereinafter, is arranged in the control panel 11. As the rail system in FIG. 1 is a DC rail system 1 operated with DC voltage, the catenary 5 represents one pole and a guide rail 12 along the track section 2 represents the other pole. Other known systems for supplying DC rails are, of course, also possible, such as, for example, a third-rail system or other systems.

The control panels 11 each have a detection device 13, a disconnection device 14 and a device for locating faults 15.

Furthermore, the protection and control device is also part of the respective control panel 11.

The protection and control device comprises the detection device 13 and the device for locating faults 15.

The detection device 13 is designed to detect operational short circuits on the energy supply chain 4.

The disconnection device 14 is connected to the detection device 13 and can interrupt the connection to the energy supply 10 in the event of an operational short circuit detected by the detection device 13. The disconnection device 14 is designed, for example, as a circuit breaker, load-break switch or power switch.

The device according to the invention for locating faults 15 is designed to determine the fault location 21 of an operational short circuit D during operation of the DC rail system 1.

Figure 4:
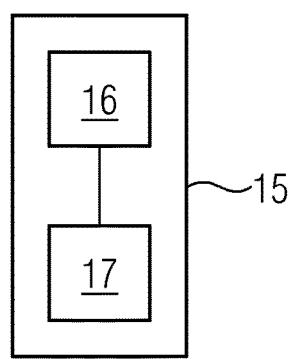
FIG. 4 A diagrammatic view of a device for locating faults according to the invention from FIG. 1.

The device for locating faults 15 in turn comprises a measuring device 16 and a computing device 17. An exemplary embodiment of the device for locating faults 15 is shown diagrammatically in FIG. 4. Another available device which determines the necessary measured values such as, for example, a measuring device (not shown) of the detection device 13 can also be used as the measuring device 16 for the device for locating faults. Likewise, the computing device 17 of the device for locating faults 15 can also be integrated into another computing device such as, for example, a computing device (not shown) of the detection device 13. Of course, the device for locating faults 15 can also be arranged at another location of the energy supply 10.

The measuring device 16 is designed to determine physical properties of the energy supply chain 4 and in particular of the supply sections 7.

The computing device 17 is connected to the measuring device 16 by means of signal technology and is designed to determine the fault location of operational short circuits.

There follows a description of how the device 15 for locating faults determines the fault location 21 of an operational short circuit D with the aid of the method according to the invention for locating faults.

First, a reference measurement is performed, for example, before the commissioning of the DC rail system 1.

In the reference measurement, at least one reference short circuit A, B, C is generated virtually artificially at a known reference fault location 18. For this purpose, for example, a cable is installed at the reference fault location 18`, 18``, 18``` between the catenary 5 and the guide rail 12. Subsequently, physical properties of the energy supply chain 4 are determined during the reference short circuit. Such physical properties are, for example, the course of the current I, which can also be referred to as leakage current, and the course of the voltage U (not shown), which can also be referred to as an error voltage, in each case over time t. The current course during the reference short circuit is shown in FIG. 2 with one curve 19`, 19``, 19``` in each case for the different reference short circuits A, B, C. In order to achieve as many measured values as possible and approximately the maximum leakage current, in the case of the reference short circuit the energy supply 10 is maintained for a relatively long time in comparison with an operational short circuit. However, it is also possible that the courses shown in FIG. 2 are not achieved because the energy supply in the reference measurement is disconnected due to the reference short circuit. In this case, the prospective course can be extrapolated in order to obtain the course according to FIG. 2 and/or its values. The extrapolation will be described in more detail hereinafter with reference to the operational short circuit.

From the determined physical properties, including the optionally extrapolated course, an inductance of the energy supply chain 4 per length of the energy supply chain is then determined in the exemplary embodiment in the figures as a calculation value. This is indicated, for example, in the unit H/m and/or mH/km.

In order to increase the accuracy of the method according to the invention, the resistance and the inductance of the energy supply chain 4 are determined before commissioning of the DC rail system 1 and a standardized value of the resistance and the inductance is determined in each case per length of the energy supply chain 4. The resistance and the inductance per length are taken into account in the determination of the calculation value in this embodiment.

The determined calculation value and/or calculation values are stored in the computing device according to the invention. The DC rail system 1 can then be put into operation.

If an operational short circuit D now occurs, it is detected by the detection device 13. The disconnection device 14 then disconnects the energy supply 10 for protection from the energy supply chain 4, for example within less than 500 ms, in particular less than 200 ms. Until disconnection has taken place, the measuring device 16 determines the physical properties of the energy supply chain 4, such as, for example, the current course 29 shown diagrammatically in FIG. 3 and a voltage curve not shown.

Figure 3:
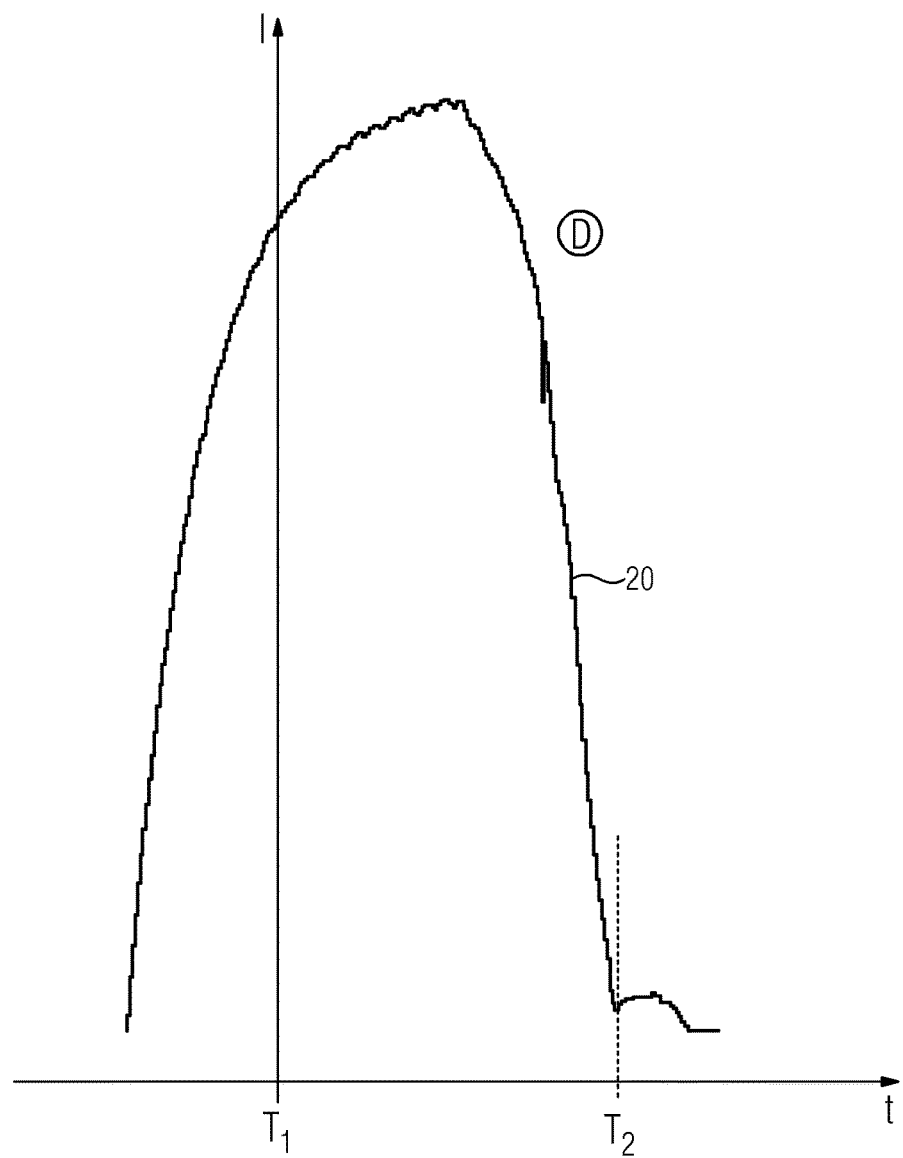
FIG. 3 A diagrammatic view of a current course for an operational short circuit in which the power supply is disconnected.

As can be seen in FIG. 3, the disconnection device 14 has interrupted the energy supply 10 at a time T2. From the time of occurrence of the short circuit to the time T1, the current I has increased due to the inductance of the energy supply chain 4. Between T1 and T2, the current I is influenced by the disconnection process. According to the invention, the fault location 21 of the operational short circuit D is determined from the course of the increase of the leakage current I before T1 and if applicable, from the course of the error voltage U. For this purpose, the curve 20 of the current course of the operational short circuit D is compared with the current course of the reference short circuit A, B, C and the fault location 21 is determined therefrom. In the determination of the fault location 21, in this embodiment, the voltage curve of the operational short circuit D is additionally also compared with the voltage curve of the reference short circuit. In order to be able to do this in an automated manner, the inductance is determined from the determined leakage current and fault voltage curves during the operational short circuit D until the time T1. The time T1 is the time at which a disconnection command is issued. From this time, the current course is influenced by the disconnection device 14 and is therefore falsified. From the time T1, the current course for determining the inductance is no longer used.

The further prospective current and voltage curve is extrapolated from the uninfluenced courses of the current and the voltage. This can be done, for example, by means of smoothing and/or linear regression using the least squares method. This is described, for example, in "A Prototype of Multiprocessor Based Distance Relay", IEEE Transactions on Power Apparatus and Systems (Volume: PAS-101, Issue: 2, February 1982). From the extrapolated curves, the inductance and the resistance of the fault loop, that is to say, of the operational short circuit, can be inferred.

As the calculation value of the inductance and of the resistance per length of the energy supply chain 4 are known in the computing device 17, the length l of the fault location 21, that is to say, the distance of the fault location 21 from the connection point 9, can thus be determined on the basis of the determined inductance of the operational short circuit D.

The invention claimed is:

1. A method for locating faults along an energy supply chain for DC current systems, the method comprising:
   generating at least one reference short circuit at a known reference fault location of the energy supply chain and determining at least one physical property of the energy supply chain during the reference short circuit;
   determining at least one physical property of the energy supply chain during an operational short circuit; and
   determining a fault location of the operational short circuit, taking into account the at least one physical property of the energy supply chain during the reference short circuit, the reference fault location, and the at least one physical property of the energy supply chain during the operational short circuit.

2. The method according to claim 1, which further comprises recognizing the operational short circuit and then triggering a disconnection of the energy supply of the energy supply chain, and determining the at least one physical property of the energy supply chain at least until the disconnection takes effect.

3. The method according to claim 2, which further comprises extrapolating a future prospective course of the at least one physical property.

4. The method according to claim 2, wherein disconnection of the energy supply occurs within less than 500 ms when an operational short circuit is detected.

5. The method according to claim 4, wherein disconnection of the energy supply occurs within less than 200 ms.

6. The method according to claim 1, which further comprises not disconnecting the energy supply during the reference short circuit or disconnecting the energy supply at a later time after the reference short circuit.

7. The method according to claim 1, which further comprises:
   determining at least one calculation value dependent on a length of the energy supply chain by way of the at least one physical property determined during the reference short circuit and by way of the reference fault location; and
   determining the fault location of the operational short circuit, taking into account the at least one calculation value and the at least one physical property during the operational short circuit.

8. The method according to claim 7, wherein the step of determining at least one calculation value comprises determining an inductance per length of the energy supply chain as the calculation value.

9. The method according to claim 7, wherein the step of determining at least one calculation value comprises determining a resistance per length of the energy supply chain as the calculation value.

10. The method according to claim 1, which further comprises determining the same physical property or physical properties of the energy supply chain in the reference short circuit and in the operational short circuit.

11. The method according to claim 1, which further comprises respectively determining a temporal progression of a leakage current and/or an error voltage as the at least one physical property of the energy supply chain during the reference short circuit and during the operational short circuit.

12. A device for locating faults along an energy supply chain of a DC current system, the device comprising:
   a measuring device configured to determine at least one physical property of the energy supply chain during a reference short circuit and during an operational short circuit; and
   a computing device configured to determine a fault location of the operational short circuit, taking into account the at least one physical property determined during the reference short circuit, the at least one physical property determined during the operational short circuit, and a reference fault location.

13. The device according to claim 12, further comprising at least one communication device configured to transmit the fault location of the operational short circuit.

14. The device according to claim 13, wherein said at least one communication device is configured to transmit the fault location of the operational short circuit to a control center of the DC current system.

15. The device according to claim 12, configured for locating a fault along an energy supply chain of a DC current system by:
   generating at least one reference short circuit at a known reference fault location of the energy supply chain and determining at least one physical property of the energy supply chain during the reference short circuit;
   determining at least one physical property of the energy supply chain during an operational short circuit; and
   determining a fault location of the operational short circuit, taking into account the at least one physical property of the energy supply chain during the reference short circuit, the reference fault location, and the at least one physical property of the energy supply chain during the operational short circuit.

16. A protection and control device for a DC current system, the protection and control device comprising:
   a detection device configured to detect an operational short circuit on an energy supply chain of the DC current system; and
   at least one device for locating faults along a-n the energy supply chain of the DC current system, the device including:
   a measuring device configured to determine at least one physical property of the energy supply chain during a reference short circuit and during an operational short circuit; and
   a computing device configured to determine a fault location of the operational short circuit, taking into account the at least one physical property determined during the reference short circuit, the at least one physical property determined during the operational short circuit, and a reference fault location.

* * * * *